US012703605B2

(12) United States Patent
Li

(10) Patent No.: US 12,703,605 B2
(45) Date of Patent: Aug. 11, 2026

(54) SELF-CHECKING DEVICE AND METHOD FOR BRAKING DEVICE AND ELEVATOR SYSTEM

(71) Applicant: Otis Elevator Company, Farmington, CT (US)

(72) Inventor: Guosong Li, Tianjin (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 973 days.

(21) Appl. No.: 17/965,376

(22) Filed: Oct. 13, 2022

(65) Prior Publication Data

US 2023/0382686 A1 Nov. 30, 2023

(30) Foreign Application Priority Data

May 24, 2022 (CN) ........................ 202210568134.8

(51) Int. Cl.

*B66B 5/00* (2006.01)
*B66B 3/00* (2006.01)
*B66B 5/02* (2006.01)
*G01R 27/26* (2006.01)
*G06F 30/27* (2020.01)

(52) U.S. Cl.

CPC ............ *B66B 5/0031* (2013.01); *B66B 3/002* (2013.01); *B66B 5/0025* (2013.01); *B66B 5/02* (2013.01); *G01R 27/2611* (2013.01); *G06F 30/27* (2020.01)

(58) Field of Classification Search

CPC ..... B66B 5/0031; B66B 3/002; B66B 5/0025; B66B 5/02; G06F 30/27; G01R 27/2611
USPC .......................................................... 187/393
See application file for complete search history.

(56) References Cited

U.S. PATENT DOCUMENTS

2021/0016999 A1* 1/2021 Wenlin ...................... B66B 1/30

FOREIGN PATENT DOCUMENTS

| | | | | |
|---|---|---|---|---|
| AU | 2017413084 A1 * | 5/2019 | .......... G01N 21/952 |
| CN | 206943283 U * | 1/2018 | |
| EP | 4056510 A1 | 6/2010 | |
| EP | 3587325 A1 | 1/2020 | |

(Continued)

OTHER PUBLICATIONS

European Search Report for Application No. 22209381.7, Issued May 25, 2023, 8 Pages.

*Primary Examiner* — Kawing Chan
(74) *Attorney, Agent, or Firm* — CANTOR COLBURN LLP

(57) ABSTRACT

A self-checking device and method for an elevator braking device and an elevator system. The self-checking device includes an inductance testing module configured to measure an electromagnetic brake coil inductance L of the braking device; and a processing module electrically connected to the inductance testing module, and storing a mathematical model of an air gap a between the movable plate and the static plate with respect to the brake coil inductance L in a brake state; the processing module is configured to execute a checking mode in the brake state of the braking device, and in the checking mode, the processing module receives a current inductance $L_0$ measured by the inductance testing module, calculates a current air gap $a_0$ based on the mathematical model stored, and determines a wear degree of the friction lining based on the current air gap $a_0$ calculated.

16 Claims, 3 Drawing Sheets

(56) References Cited

FOREIGN PATENT DOCUMENTS

| | | | | | |
|---|---|---|---|---|---|
| WO | 2010061049 | A1 | | 6/2010 | |
| WO | WO-2015193834 | A1 | * | 12/2015 | ............... B66D 5/08 |
| WO | WO-2018202745 | A1 | * | 11/2018 | ........... F16D 66/028 |

* cited by examiner

SELF-CHECKING DEVICE AND METHOD FOR BRAKING DEVICE AND ELEVATOR SYSTEM

FOREIGN PRIORITY

This application claims priority to Chinese Patent Application No. 202210568134.8, filed May 24, 2022, and all the benefits accruing therefrom under 35 U.S.C. § 119, the contents of which in its entirety are herein incorporated by reference.

FIELD OF THE INVENTION

The present invention relates to the field of braking devices, in particular to a self-checking device and method for a braking device.

BACKGROUND OF THE INVENTION

Braking devices are widely used in various fields. In the field of elevators, failures of braking devices lead to many fatal accidents every year, and in failures of braking devices, excessive wear of friction linings is an important factor. Excessive wear of friction linings leads to insufficient friction material, making it difficult to stop the elevator in an emergency. It also leads to increased extension of the brake springs and reduced braking force, and leads to reduced braking torque. In order to ensure the safety of the elevator, the safety standard stipulates that the thickness of the friction lining of the braking device of the elevator system needs to be regularly checked. The conventional practice is to estimate the friction lining thickness by measuring the air gap thickness with a feeler gauge on site, for example, every two weeks, by the maintenance personnel.

SUMMARY OF THE INVENTION

The object of the present invention is to solve or at least alleviate the problems existing in the prior art.

According to one aspect, a self-checking device for a braking device is provided. The braking device comprises a static plate, a movable plate movably connected to the static plate, and a friction lining provided on a side of the movable plate facing away from the static plate and controlling the movement of the movable plate relative to the static plate by an electromagnetic brake coil. The self-checking device comprises: an inductance testing module configured to measure an electromagnetic brake coil inductance L of the braking device; and a processing module electrically connected to the inductance testing module, and storing a mathematical model of an air gap a between the movable plate and the static plate with respect to the electromagnetic brake coil inductance L in a brake state; wherein, the processing module is configured to execute a checking mode in the brake state of the braking device, and in the checking mode, the processing module receives a current inductance $L_0$ measured by the inductance testing module, calculates a current air gap $a_0$ based on the mathematical model stored, and determines a wear degree of the friction lining based on the current air gap $a_0$ calculated.

Optionally, in the self-checking device, the processing module is configured to repeatedly execute the checking mode at specific time intervals.

Optionally, in the self-checking device, the processing module is configured to send an alarm message or perform a shutdown operation when the current air gap $a_0$ monitored is greater than a threshold.

Optionally, in the self-checking device, the mathematical model is a=f(L), wherein at least two sets of data of corresponding air gaps and electromagnetic brake coil inductances ($a_1$, $L_1$, $a_2$, $L_2$) are received, in a testing mode of the braking device, for training the mathematical model.

Optionally, in the self-checking device, the mathematical model is also related to the number of turns N of the brake coil and a total magnetic resistance R_IRON of the static plate and the movable plate.

Optionally, in the self-checking device, the mathematical model is $$a = \frac{k_1}{L} - k_2$$

wherein, coefficients $k_1$ and $k_2$ are determined based on at least two sets of data of corresponding air gaps and brake coil inductances ($a_1$, $L_1$, $a_2$, $L_2$).

Optionally, in the self-checking device, the at least two sets of data of corresponding air gaps and brake coil inductances are obtained in the testing mode, wherein, the air gap $a_1$ and the brake coil inductance $L_1$ are measured in the brake state, and the air gap $a_2$ and the brake coil inductance $L_2$ are measured in another brake state entered by lifting the movable plate to insert an object with a specific thickness D between the movable plate and the brake component, and then releasing the movable plate.

Optionally, in the self-checking device, the processing module is further configured to train the mathematical model a=f(L) based on additional data of corresponding air gap and brake coil inductance ($a_3$, $L_3$) obtained during maintenance.

Optionally, in the self-checking device, the inductance testing module is a circuit capable of measuring inductance, such as a PWM circuit.

An elevator system comprising the self-checking device according to the various embodiments is further provided.

A self-checking method for a braking device is further provided, which comprises: establishing a mathematical model of an air gap a between the movable plate and the static plate with respect to a brake coil inductance L in a brake state; executing a checking mode in the brake state of the braking device to measure a current inductance $L_0$; and calculating, based on the mathematical model, a current air gap $a_0$, and determining a wear degree of a friction lining based on the current air gap $a_0$ calculated.

Optionally, the method further comprises repeatedly executing the checking mode at specific time intervals.

Optionally, the method further comprises sending an alarm message or performing a shutdown operation when the current air gap $a_0$ monitored is greater than a threshold.

Optionally, the mathematical model is a=f(L), and the method further comprises: obtaining, in a testing mode, at least two sets of data of corresponding air gaps and brake coil inductances ($a_1$, $L_1$, $a_2$, $L_2$) to train the mathematical model.

Optionally, the mathematical model is also related to the number of turns N of the brake coil and a total magnetic resistance R_IRON of the static plate and the movable plate.

Optionally, the mathematical model is $$a = \frac{k_1}{L} - k_2,$$

wherein, coefficients $k_1$ and $k_2$ are determined based on at least two sets of data of corresponding air gaps and brake coil inductances ($a_1$, $L_1$, $a_2$, $L_2$).

Optionally, the method further comprises obtaining, in the testing mode, the at least two sets of data of corresponding air gaps and brake coil inductances ($a_1$, $L_1$, $a_2$, $L_2$), wherein, the air gap $a_1$ and the brake coil inductance $L_1$ are measured in a brake state, and the air gap $a_2$ and the brake coil inductance $L_2$ are measured in another brake state entered by lifting the movable plate to insert an object with a specific thickness D between the movable plate and the brake component, and then releasing the movable plate.

Optionally, the method further comprises training the mathematical model a=f(L) based on additional data of corresponding air gap and brake coil inductance ($a_3$, $L_3$) obtained during maintenance.

Optionally, the method further comprises using a PWM circuit to measure the brake coil inductance.

A computer-readable medium having a computer program stored thereon is further provided, wherein the computer program, when executed, performs the method according to the various embodiments.

The device and method according to the embodiments of the present invention can automatically monitor the thickness of the friction lining of a braking device.

BRIEF DESCRIPTION OF THE DRAWINGS

With reference to the accompanying drawings, the disclosure of the present invention will become easier to understand. Those skilled in the art would easily understand that these drawings are for the purpose of illustration, and are not intended to limit the protection scope of the present invention. In addition, in the figures, similar numerals are used to denote similar components, where.

DETAILED DESCRIPTION OF EMBODIMENT(S) OF THE INVENTION

Figure 1:
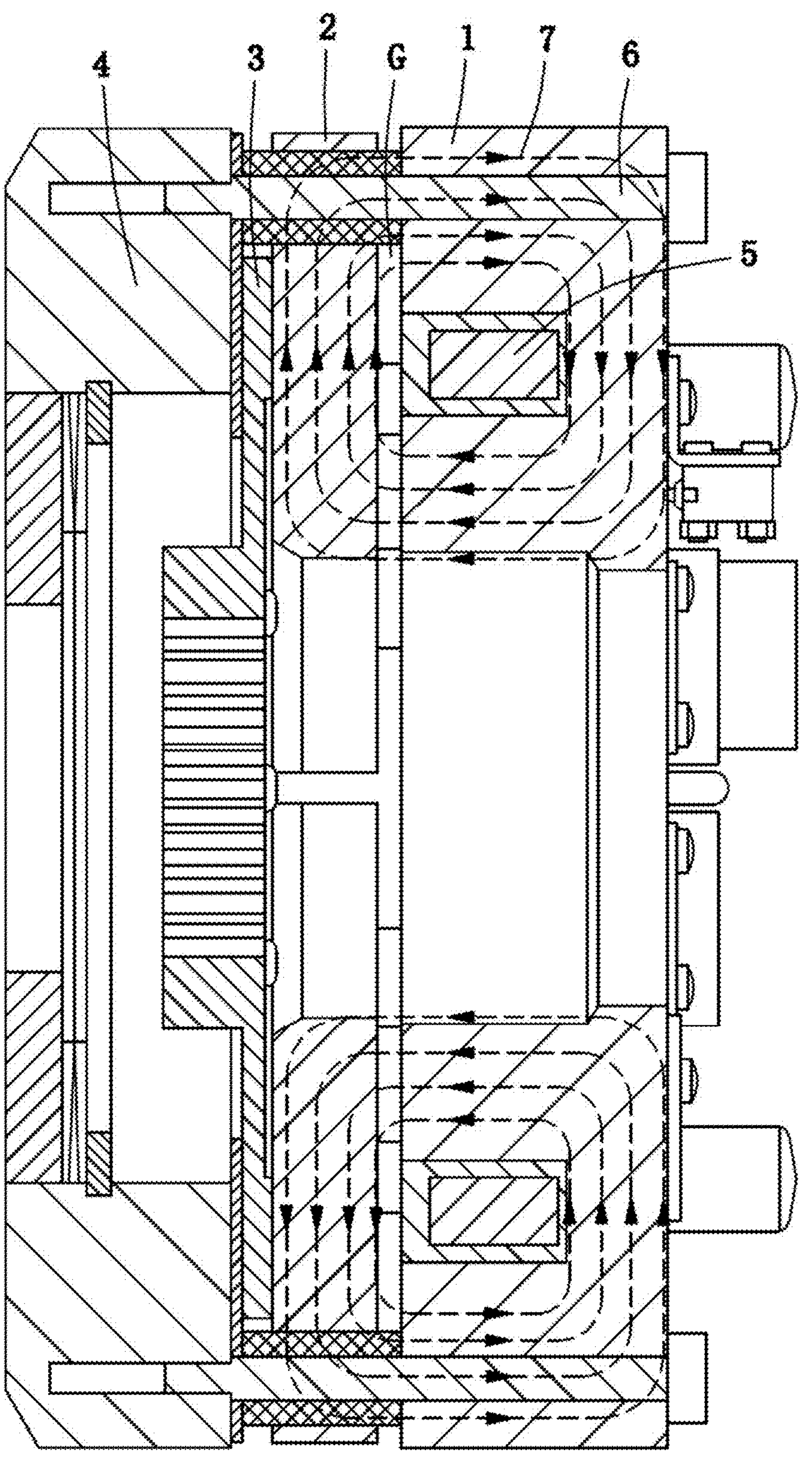
FIG. 1 shows a schematic diagram of an exemplary braking device.

With reference to FIG. 1, a cross-sectional view of an exemplary braking system is shown. The braking system is for use in, for example, an elevator system, to brake a traction machine of the elevator. An exemplary braking system may comprise a static plate 1 that remains stationary; a movable plate 2 that is movably connected to the static plate, for example, the movable plate 2 can move along a guiding element 6; a friction lining 3 on the side of the movable plate 2 facing away from the static plate 1 and a brake component 4. The brake component 4 is coupled, for example, to the drive shaft of the elevator traction machine. An electromagnetic brake coil 5 is arranged in the static plate 1. Although not shown, a spring is also arranged between the static plate 1 and the movable plate 2 to urge the movable plate 2 to be pushed toward the brake component 4, so that the friction lining 3 on the movable plate 2 and the brake component 4 are engaged with each other when the electromagnetic brake coil 5 is not energized, thereby suppressing the rotation of the drive shaft of the traction machine of the elevator. This state is also referred to as a brake state. When the electromagnetic brake coil 5 is energized, a magnetic field 7 is generated, thereby generating an attractive force to the movable plate 2, which overcomes the thrust of the spring to attract the movable plate 2 to be in contact with the static plate 1, thereby releasing the brake component 4 to allow the rotation of the drive shaft of the traction machine. During the long-term use of the aforementioned braking system, the friction lining 3 will be constantly worn, and when the thickness of the friction lining 3 is smaller than a certain threshold, the friction lining 3 needs to be replaced. In the existing method, the maintenance personnel regularly measure onsite the air gap a between the static plate 1 and the movable plate 2 in the brake state, for example, using a feeler gauge to measure the gap a. Since the sum of the thicknesses of the air gap a and the friction lining 3 is a fixed value, the thickness of the friction lining 3 can be calculated through the air gap a.

According to an embodiment of the present invention, a self-checking device and method are proposed, which provide an automatic checking of the wear degree of the friction lining and at least reduce the required frequency of on-site measurement. Upon research, it is found that there is a certain relationship between the aforementioned air gap a and the brake coil inductance L in the brake state. Therefore, the air gap a can be automatically calculated by measuring the brake coil inductance L in the brake state, thereby realizing the self-checking of the air gap a and the wear degree of the friction lining Based on this concept, according to an embodiment of the present invention, a self-checking device is provided, which comprises: an inductance testing module configured to measure an electromagnetic brake coil inductance L of the braking device; and a processing module electrically connected to the inductance testing module, and storing a mathematical model of an air gap a between the movable plate and the static plate with respect to the brake coil inductance L in the brake state; wherein, the processing module is configured to perform a checking mode in the brake state of the braking device, and in the checking mode, the processing module receives a current inductance $L_0$ measured by the inductance testing module, calculates a current air gap $a_0$ based on the mathematical model stored, and determines a wear degree of the friction lining based on the current air gap $a_0$ calculated.

The relationship between the air gap a and the brake coil inductance L in the brake state can be preset by the elevator supplier at first, but this relationship is also directly related to the actual on-site condition of the elevator system. Therefore, some data can be obtained by measurement in a testing mode to train the mathematical model, so that it can be more accurate in subsequent use. In some embodiments, the mathematical model is a=f(L), and the mathematical model is trained by receiving, in the testing mode of the braking device, at least two sets of data of corresponding air gaps and brake coil inductances ($a_1$, $L_1$, $a_2$, $L_2$).

In some embodiments, the mathematical model can be established based on theory first, for example, it can first be based on the inductance calculation formula:

$$L = \frac{N^2}{\text{R\_IRON} + \text{R\_air}} \tag{1}$$

Wherein, N represents the number of turns of the brake coil. For a specific braking device, the number of turns N of the brake coil is a fixed value, which can be learned by consulting the product specifications. R_IRON represents the total magnetic resistance of the magnetic field 7 in the movable plate 2 and the static plate 1. For a specific braking device, the value R_IRON is a fixed value. R_air represents the total magnetic resistance of the magnetic field 7 in the air gap a, which is related to the size of the air gap a. It should be understood that while the mathematical model according to the illustrated embodiment is based on the aforementioned inductance formula, in alternative embodiments, however, other inductance formulas may be utilized to establish the model between the inductance and the air gap, and any other influencing factors may also be included in the model as variables to train the model. Therefore, the model derived below is exemplary only.

The relationship between the impedance R_air in the air gap a and the size of the air gap a can be written as the following formula:

$$R\_air = \frac{a}{\mu_0 \cdot S} \tag{2}$$

Wherein, $\mu_0$ to is the magnetoresistance coefficient of the air, which is a fixed value, and S is the cross-sectional area of the magnetic field passing through the air gap, which is a fixed value for a specific braking device. If $$\frac{1}{\mu_0 \cdot S}$$

in formula (2) is set as coefficient K, then formula (2) can be abbreviated as:

$$R\_air = K \cdot a \tag{3}$$

Putting the above formula (3) into formula (1), it can be obtained that:

$$L = \frac{N^2}{R\_IRON + K \cdot a} \tag{4}$$

By changing formula (4), the following model can be obtained:

$$a = \frac{N^2}{KL} - \frac{R\_IRON}{K} \tag{5}$$

It can be seen that the mathematical model a=f(L) is also related to the number of turns N of the brake coil and the total magnetoresistance R_IRON of the static plate and the movable plate. Specific N and R_IRON values can be set, and the mathematical mode a=f(L) can be trained using the data of actual measured L and a as input, or these values (N and R_IRON) can be calculated based on actual data without setting N and R_IRON.

In some embodiments, it can be assumed that $$k_1 = \frac{N^2}{K},$$
$$k_2 = \frac{R\_IRON}{K},$$

then formula (5) can be rewritten as:

$$a = \frac{k_1}{L} - k_2 \tag{6}$$

Figure 2:
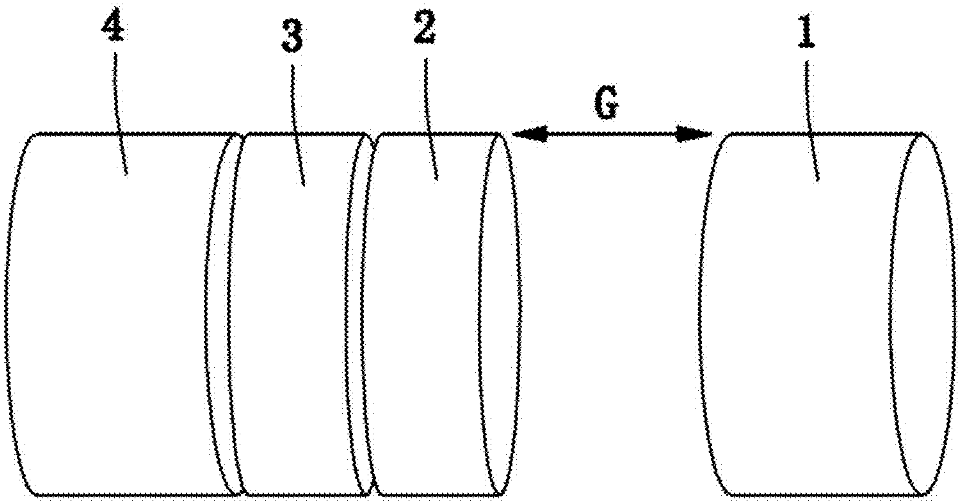
FIGS. 2 and 3 respectively show schematic diagrams of a braking device during a testing mode.
Figure 3:
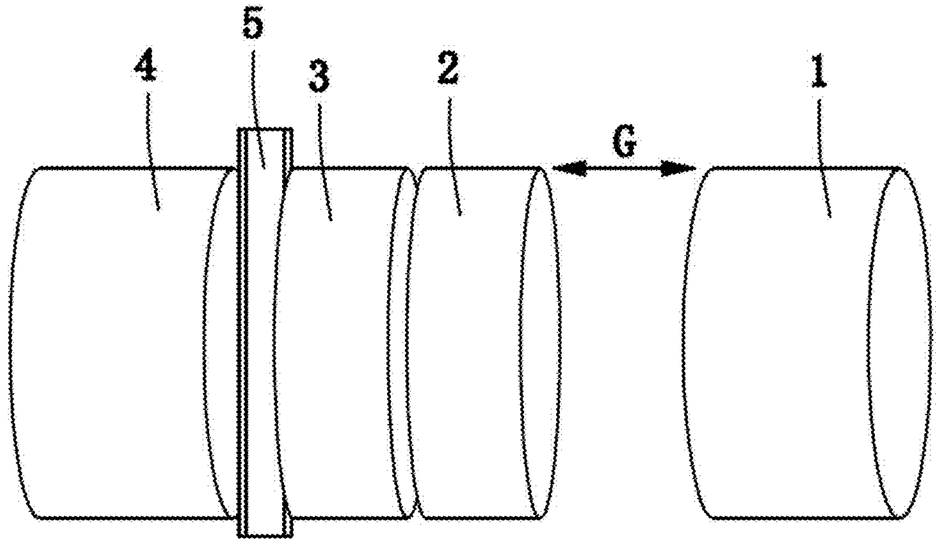
Figure 4:
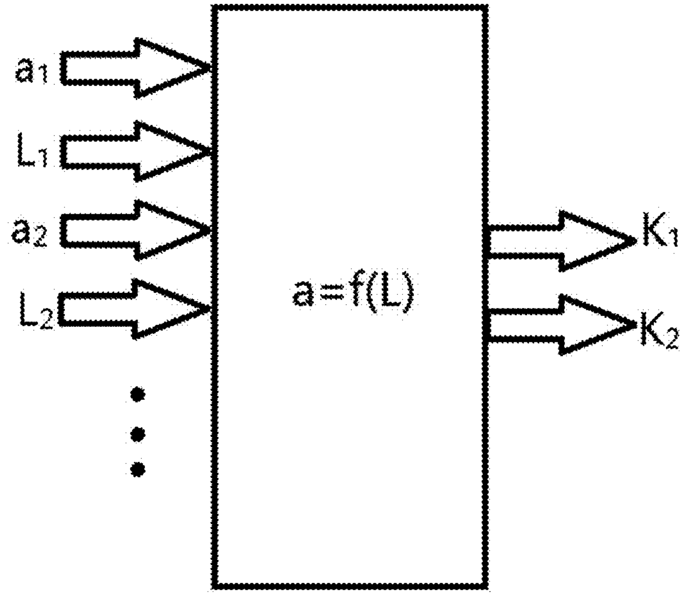
FIGS. 4 and 5 respectively show schematic diagrams of the self-checking method according to the embodiment in a testing mode and a checking mode.

It can be seen from the above derivation that the mathematical model a=f(L) according to an embodiment can be written as formula (6). The formula (6) includes unknown coefficients $k_1$ and $k_2$, and in order to train the model, at least two sets of data of corresponding air gaps and brake coil inductances are required. In some embodiments, as shown in FIGS. 2 to 4, these data can be obtained during the installation and testing phases of the elevator braking system, for example, by the following method: measuring an air gap $a_1$ and a brake coil inductance $L_1$ in the brake state shown in FIG. 2; and measuring an air gap $a_2$ and a brake coil inductance $L_2$ in another brake state as shown in FIG. 3 which is entered by lifting the movable plate 2 to insert an object 5 of a specific thickness D, such as a feeler gauge, between the movable plate 2 and the brake component 4, and then releasing the movable plate. The air gap $a_2$ at this time can also be calculated by $a_1$-D. As shown in FIG. 4, by inputting $a_1$, $L_1$, $a_2$, and $L_2$, the processor can determine the coefficients $k_1$; and $k_2$ in the model. Alternatively, in order to avoid the influence of other factors such as measurement errors on the mathematical model, objects 5 with different thicknesses can be inserted according to the above method to obtain more sets of data, such as 3 sets, 4 sets, or even 10 sets, etc., and these data are processed using known mathematical methods, thereby making the model more accurate.

Figure 5:
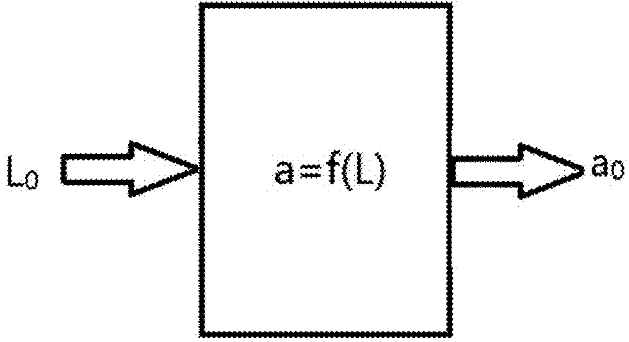

After obtaining an accurate mathematical model, the braking device can be put into daily use. It should be understood that the use procedure and the testing procedure can be performed independently. During use, the processor may be configured to execute a checking mode in which the current air gap $a_0$ may be calculated based on the current measured brake coil inductance $L_0$. For example, the processing module is configured to repeat the checking mode at specific time intervals, such as every two weeks. In the checking mode, as shown in FIG. 5, the brake coil inductance $L_0$ in the brake state is measured, the current air gap $a_0$ is calculated, and the wear degree of the friction lining is determined based thereupon accordingly. For example, in some embodiments, the processing module is configured to perform certain operations when the monitored current air gap is greater than a threshold, for example, sending an alarm message to an operator for maintenance, such as replacing the friction lining, or even shutting down the elevator system.

The aforementioned automatic checking device can replace traditional manual maintenance or at least reduce the frequency of manual maintenance. For example, manual measurements can be performed at longer intervals, such as one month or two months. However, during manual maintenance, the data of corresponding air gap and brake coil inductance ($a_3$, $L_3$) may continue to be measured, and the processing module is further configured to train the mathematical model a=f(L) based on additional data of corresponding air gap and brake coil inductance ($a_3$, $L_3$) obtained during maintenance, thereby correcting various parameters. Considering that the data of the air gap and the brake coil inductance obtained during the testing mode are the data obtained when the friction lining is not worn, while the data after the actual wear of the friction lining can be obtained during routine maintenance, use of these data for the correction of the mathematical model can make the mathematical model more accurate, especially in the next wear cycle after the friction lining is replaced. The model corrected by using the data when the friction lining is worn obtained in the previous cycle can be used to estimate the air gap more accurately.

The brake coil inductance can be measured in various known ways, for example, a sinusoidal voltage may be input using a PWM circuit (Pulse Width Modulation Circuit) for measurement. As an example, the inductance can be calculated based on the following inductive reactance formula:

$$U/I = R + 2 * 3.14 * F * L$$

The above equation is a vector equation, where U is the sinusoidal voltage input through the PWM circuit;

I is the measured sinusoidal current;

F is the frequency of the injected sinusoidal voltage;

L is the inductance to be measured;

R is the resistance of the brake coil.

For some braking systems, a PWM circuit already exists, which, for example, is used for modulating the input voltage, so that the control logic of the PWM circuit can be simply adjusted to measure the inductance of the brake coil. A PWM circuit can be added to a system that is not configured with such a circuit. In some embodiments, for elevator braking systems, the PWM circuit may be integrated into the inverter circuit of the elevator traction machine. Therefore, for an elevator system, the addition of the self-checking system according to the embodiments of the present invention will not bring a significant increase in cost, and for the existing elevator systems, the aforementioned functions can be realized only by simple modification. In addition, the brake coil inductance can be measured by any other suitable means.

According to another aspect, an elevator system comprising the self-checking device according to the various embodiments is further provided.

According to yet another aspect, a self-checking method for a braking device is provided, which comprises: establishing a mathematical model of an air gap a between the movable plate and the static plate with respect to a brake coil inductance L in a brake state; executing a checking mode in the brake state of the braking device to measure a current inductance $L_0$; and calculating a current air gap $a_0$ based on the mathematical model, and determining a wear degree of the friction lining based on the current air gap $a_0$ calculated. According to still another aspect, a computer-readable medium with a computer program stored thereon is further provided, wherein the computer program, when executed, performs the method according to the various embodiments.

The specific embodiments described above are merely intended to describe the principles of the present invention more clearly, wherein various components are clearly shown or described to facilitate the understanding of the principles of the present invention. Those skilled in the art may, without departing from the scope of the present invention, make various modifications or changes to the present invention. Therefore, it should be understood that these modifications or changes should be included within the scope of patent protection of the present invention.

What is claimed is:

1. A self-checking device for a braking device, the braking device comprising a static plate, a movable plate movably connected to the static plate, and a friction lining provided on a side of the movable plate facing away from the static plate, and an electromagnetic brake coil moving the movable plate relative to the static plate, wherein, the self-checking device comprises:

an inductance testing module configured to measure an electromagnetic brake coil inductance L of the braking device; and a processing module electrically connected to the inductance testing module, and storing a mathematical model of an air gap a between the movable plate and the static plate with respect to the electromagnetic brake coil inductance L in a brake state;

wherein, the processing module is configured to execute a checking mode in the brake state of the braking device, and in the checking mode, the processing module receives a current inductance Lo measured by the inductance testing module, calculates a current air gap ao based on the mathematical model stored, and determines a wear degree of the friction lining based on the current air gap ao calculated;

wherein the mathematical model is a=f(L), and the mathematical model is trained by at least two sets of data of corresponding air gaps and electromagnetic brake coil inductances (allla2, L2) received in a testing mode of the braking device.

2. The self-checking device according to claim 1, wherein the processing module is configured to repeatedly execute the checking mode at specific time intervals.

3. The self-checking device according to claim 1, wherein the processing module is configured to send an alarm message or perform a shutdown operation when the current air gap $a_0$ monitored is greater than a threshold.

4. The self-checking device according to claim 1, wherein the mathematical model is also related to number of turns N of the brake coil, and total magnetic resistance R_IRON of the static plate and the movable plate.

5. The self-checking device according to claim 1, wherein the mathematical model is $$a = \frac{k_1}{L} - k_2,$$

wherein, coefficients $k_1$ and $k_2$ are determined based on at least two sets of data of corresponding air gaps and brake coil inductances ($a_1$, $L_1$, $a_2$, $L_2$).

6. The self-checking device according to claim 1, wherein the at least two sets of data of corresponding air gaps and brake coil inductances ($a_1$, $L_1$, $a_2$, $L_2$) are obtained in the testing mode, wherein, the air gap $a_1$ and the brake coil inductance $L_1$ are measured in the brake state, and the air gap $a_2$ and the brake coil inductance $L_2$ are measured in another brake state entered by lifting the movable plate to insert an object with a specific thickness D between the movable plate and the brake component, and then releasing the movable plate.

7. The self-checking device according to claim 6, wherein the processing module is further configured to train the mathematical model a=f(L) based on additional data of corresponding air gap and brake coil inductance ($a_3$, $L_3$) obtained during maintenance.

8. The self-checking device according to claim 1, wherein the inductance testing module is a PWM circuit.

9. An elevator system, wherein the elevator system comprises the self-checking device according to claim 1.

10. A self-checking method for a braking device of an elevator system, the braking device comprising a static plate, a movable plate movably connected to the static plate, and a friction lining provided on a side of the movable plate facing away from the static plate, and an electromagnetic brake coil moving controlling movement of the movable plate relative to the static plate t, wherein, the method comprises:

establishing a mathematical model of an air gap a between the movable plate and the static plate with respect to a brake coil inductance L in a brake state;

executing a checking mode in the brake state of the braking device to measure a current inductance Lo; and calculating a current air gap ao based on the mathematical model, and determining a wear degree of the friction lining based on the current air gap ao calculated;

wherein the method further comprises at least one of (i) sending an alarm message to an operator when the current air gap ao monitored is greater than a threshold or (ii) performing a shutdown operation of the elevator system when the current air gap ao monitored is greater than a threshold;

wherein the mathematical model is a=f(L), and the method further comprises: obtaining, in a testing mode, at least two sets of data of corresponding air gaps and brake coil inductances (alLa2L) to train the mathematical model a=f(L).

11. The self-checking method according to claim 10, wherein the method further comprises repeatedly executing the checking mode at specific time intervals.

12. The self-checking method according to claim 10, wherein the mathematical model is also related to number of turns N of the brake coil and total magnetic resistance R_IRON of the static plate and the movable plate.

13. The self-checking method according to claim 10, wherein the mathematical model is $$a = \frac{k_1}{L} - k_2,$$

wherein, coefficients $k_1$ and $k_2$ are determined based on at least two sets of data of corresponding air gaps and brake coil inductances ($a_1$, $L_1$, $a_2$, $L_2$).

14. The self-checking method according to claim 10, wherein the method further comprises obtaining, in the testing mode, the at least two sets of data of corresponding air gaps and brake coil inductances ($a_1$, $L_1$, $a_2$, $L_2$), wherein, the air gap $a_1$ and the brake coil inductance $L_1$ are measured in the brake state, and the air gap $a_2$ and the brake coil inductance $L_2$ are measured in another brake state entered by lifting the movable plate to insert an object with a specific thickness D between the movable plate and the brake component, and then releasing the movable plate.

15. The self-checking method according to claim 10, further comprising training the mathematical model a=f(L) based on additional data of corresponding air gap and brake coil inductance ($a_3$, $L_3$) obtained during maintenance.

16. The self-checking method according to claim 10, wherein the method further comprises measuring the brake coil inductance using a PWM circuit to produce a sinusoidal voltage input to the electromagnetic brake coil.

* * * * *